(12) United States Patent
Liu et al.

(10) Patent No.: US 8,138,263 B2
(45) Date of Patent: Mar. 20, 2012

(54) FLEXIBLE, LOW DIELECTRIC LOSS COMPOSITION AND METHOD FOR PREPARING THE SAME

(75) Inventors: Shur-Fen Liu, Hsinchu County (TW); Meng-Huei Chen, Hsinchu County (TW); Man-Chun Yu, Hsinchu County (TW)

(73) Assignee: Industrial Technology Research Institute, Hsinchu County (TW)

( * ) Notice: Subject to any disclaimer, the term of this patent is extended or adjusted under 35 U.S.C. 154(b) by 428 days.

(21) Appl. No.: 12/344,484

(22) Filed: Dec. 27, 2008

(65) Prior Publication Data

US 2009/0170993 A1 Jul. 2, 2009

(30) Foreign Application Priority Data

Dec. 28, 2007 (TW) .............................. 96150772 A

(51) Int. Cl.
*C08K 3/22* (2006.01)
*C08L 101/00* (2006.01)
*H01B 3/30* (2006.01)

(52) U.S. Cl. .......... 525/50; 524/413; 524/423; 524/500; 524/502

(58) Field of Classification Search .................. 524/413, 524/423, 500, 502; 525/50
See application file for complete search history.

(56) References Cited

U.S. PATENT DOCUMENTS

| | | | |
|---|---|---|---|
| 4,996,097 A | 2/1991 | Fischer | |
| 5,162,977 A | 11/1992 | Paurus et al. | |
| 5,739,193 A | 4/1998 | Walpita et al. | |
| 5,800,575 A | 9/1998 | Lucas | |
| 5,870,274 A | 2/1999 | Lucas | |
| 5,962,122 A | 10/1999 | Walpita et al. | |
| 6,150,456 A | 11/2000 | Lee et al. | |
| 6,274,224 B1 | 8/2001 | O'Bryan et al. | |
| 6,608,760 B2 | 8/2003 | Hartman et al. | |
| 6,657,849 B1 | 12/2003 | Andresakis et al. | |
| 6,905,757 B2 | 6/2005 | Matsushima et al. | |
| 2007/0117898 A1* | 5/2007 | Tan et al. ...................... | 524/413 |

FOREIGN PATENT DOCUMENTS

CN 1908063 A 2/2007

OTHER PUBLICATIONS

Second examination opinion notification issued by the China Intellectual Property Office on May 18, 2011, for the above-referenced application's counterpart application in China (Application No. 200810008114.5).
Gu, "New development of copper clad laminate in our country", Printed Circuit Info., 2000(1), pp. 10-12 (Dec. 31, 2000).

* cited by examiner

*Primary Examiner* — Kelechi Egwim
(74) *Attorney, Agent, or Firm* — Pai Patent & Trademark Law Firm; Chao-Chang David Pai

(57) ABSTRACT

A flexible, low dielectric loss composition, used to fabricate a flexible substrate, is provided. The composition includes: $SrTiO_3$ and/or $Ba(Sr)TiO_3$ ceramic particle, with a particular size between 30 nm and 2 μm, in an amount of 20-80% by weight of the composition; at least one flexile macromolecule in an amount of 1.0-50% by weight of the composition, wherein the macromolecules have functional groups of hydroxyl group, carboxyl group, allyl group, amino group, or chain aliphatic epoxy group; and a thermosetting organic resin.

27 Claims, No Drawings

FLEXIBLE, LOW DIELECTRIC LOSS COMPOSITION AND METHOD FOR PREPARING THE SAME

BACKGROUND OF THE INVENTION

1. Field of the Invention

The invention relates to a composition for fabricating a substrate, and more particularly to a composition for fabricating a substrate with high dielectric constant, low dielectric loss, and high flexibility, applied in PCB, IC substrate, or RF modules.

2. Description of the Related Art

Recently, with the increasing demands for multi-functional electronic products, electrical devices with flexibility have been widely developed to increase functions and convenience thereof.

Passive components with flexibility have been developed to increase the yield and reliability of electrical devices and improve electrical device integration employing the same, thereby facilitating the applications of soft or hard substrates.

U.S. Pat. Nos. 5,162,977 and 6,274,224 B1 discloses embedded capacitor technologies and structures. The capacitor comprises an electrical insulating layer formed from epoxy and barium titanate particles. However, the capacitor exhibits no flexibility and cannot be used in flexible substrates.

U.S. Pat. No. 5,739,193 discloses a polymeric composition having a temperature-stable dielectric constant, comprising a thermoplastic polymer, a high dielectric ceramic powder, and a second ceramic material. The polymeric composition has a high dielectric constant that only slightly varies with temperature.

U.S. Pat. No. 6,608,760 discloses a dielectric material which can serve as the material of printed wiring boards. The dielectric material comprises at least one organic polymer and at least one filler material. The dielectric substrate of this invention has a dielectric constant that varies less than 15% over a temperature range from −55° to 125° C.

U.S. Pat. No. 6,905,757 discloses a composition comprising resin and spherical dielectric powder and a built-in capacitor fabricated thereby. However, the built-in capacitor exhibits no flexibility.

U.S. Pat. Nos. 6,150,456 and 6,657,849 disclose a dielectric constant flexible film made of polyimide resin. JP Patent 338667 discloses a photosensitive polymer exhibiting flexibility. The polymer cannot be applied in a high-bandwidth electrical device due to inferior processing capacity.

U.S. Pat. Nos. 4,996,097 and 5,962,122 discloses a polymeric composition having a high dielectric constant made from a thermotropic liquid crystalline and a ceramic. The composition is not suitable for fabricating an embedded capacitor substrate by a printed circuit board process.

Therefore, it is necessary to develop a low dielectric loss, high dielectric constant and high flexibility dielectric material suitable for a soft printed circuit board process used for fabrication of an embedded capacitor substrate.

BRIEF SUMMARY OF THE INVENTION

An exemplary embodiment of a flexible, low dielectric loss composition, used to fabricate a flexible substrate, comprises: $SrTiO_3$ and/or $Ba(Sr)TiO_3$ ceramic particle, with a particular size between 30 nm and 2 μm, in an amount of 20-80% by weight of the composition; at least one flexile macromolecule in an amount of 1.0-50% by weight of the composition, wherein the macromolecules have functional groups of hydroxyl group, carboxyl group, allyl group, amino group, or chain aliphatic epoxy group; and a thermosetting organic resin.

Another exemplary embodiment a method for preparing the aforementioned composition comprises: providing at least one thermosetting organic resin dissolved in a solvent to obtain a solution; adding at least one flexile macromolecule, a curing agent, and a catalyst into the solution, wherein the flexile macromolecules have functional groups of hydroxyl group, carboxyl group, allyl group, amino group, or chain aliphatic epoxy group; and adding $SrTiO_3$ and/or $Ba(Sr)TiO_3$ ceramic particle into the solution, wherein the $SrTiO_3$ and/or $Ba(Sr)TiO_3$ ceramic particle has a particular size between 30 nm and 2 μm.

A detailed description is given in the following embodiments with reference to the accompanying drawings.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a composition, suitable for fabrication of a substrate with high dielectric constant, low dielectric loss, and high flexibility. The composition comprises ceramic particle, at least one flexile macromolecule, and a thermosetting organic resin, wherein the flexile macromolecules serve as a softening agent to solve the problem for conventional substrates where the conventional substrates are too brittle and break off during the fabrication process.

The ceramic particle of the present invention comprises high dielectric constant, such as $SrTiO3$ and/or $Ba(Sr)TiO3$ ceramic particle with a particular size between 30 nm and 2 μm. The ceramic particle can be in an amount of 20-80 wt % by weight of the composition, preferable 50-77 wt %.

In another embodiment, the ceramic particle can be further doped with at least one metal ion comprising Ca, Mg, Zr, Bi, Co, Si, Mn, Sn or Zn ion. The ceramic particle materials may have the least possible dielectric losses and a slight temperature dependence of the high-frequency properties (NPO or so-called SL materials).

The flexile macromolecules comprise macromolecules with functional groups, such as macromolecules with hydroxyl group, macromolecules with carboxyl group, macromolecules with allyl group, macromolecules with amino group, or macromolecules with chain aliphatic epoxy group. The at least one flexile macromolecule can be in an amount of 1.0-50 wt % by weight of the composition, preferably 2.5-10 wt %.

The macromolecules with hydroxyl group comprise polyvinyl butyral or hydroxyl groups terminated polyester. The macromolecules with carboxyl group comprise carboxylic acid terminated acrlonitrile or carboxylic acid terminated polyester. The macromolecules with allyl group comprise polybutadiene, styrene-ethylenelbutylene-styrene, styrene-butadiene-styrene or styrene-isoprene-styrene. The macromolecules with amino group comprise polyamide, polyamide-polyimide, polyurea, or polyurethanes. The macromolecules with chain aliphatic epoxy group comprise the following compounds:

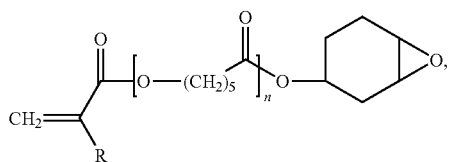
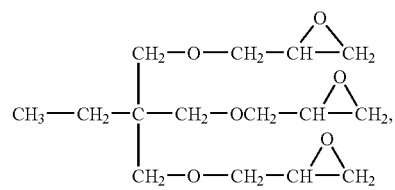
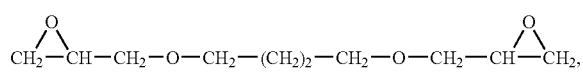
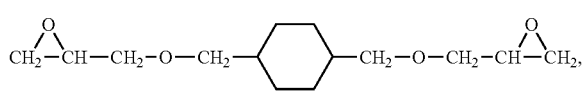
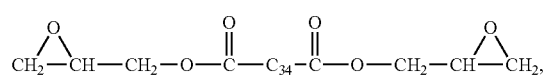
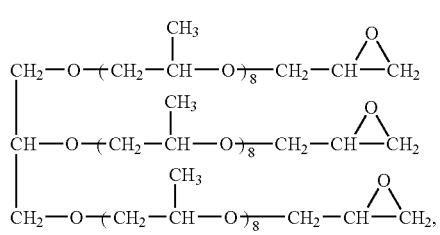
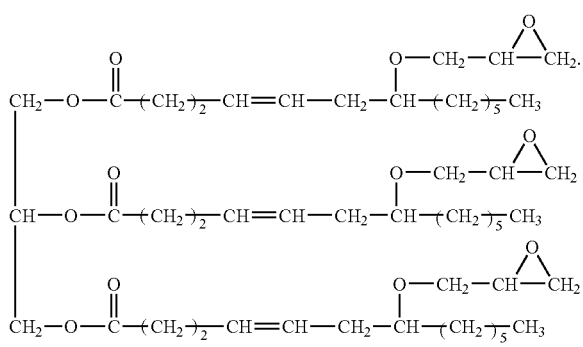

In one embodiment of the invention, the macromolecules can be reacted with an epoxy resin in advance to increase the stability thereof, wherein the epoxy resin comprises bisphenol-A diglycidyl ether, tetra bromobisphenol A ether, dicyclopentadiene epoxy resin (cycloaliphatic epoxy resin), naphthyl epoxy resin, diphenyl epoxy resin, novolac epoxy resin or o-cresol-formaldehyde epoxy resin.

Further, in another embodiment, the composition can further comprise a dispersing agent, wherein the dispersing agent comprises polyester-amide, polyester, or copolymer of polyester-amide/polyester. The dispersing agent can be in an amount of 1-10% by weight of the composition, preferably 2-7 wt %.

The thermosetting organic resin comprises epoxy resin and/or acrylic resin. The above epoxy resin comprises bisphenol-A diglycidyl ether, tetra bromobisphenol A ether, dicyclopentadiene epoxy resin (cycloaliphatic epoxy resin), naphthyl epoxy resin, diphenyl epoxy resin, novolac epoxy resin or o-cresol-formaldehyde epoxy resin. In some embodiments, the thermosetting organic resin comprises epoxy resin/polyphenyl ether, epoxy resin/polyphenyl ether/polybutadiene or epoxy resin/acrylic resin combinations.

The flexible substrate fabricated from the composition of the invention has high dielectric constant, loss dielectric loss, and high flexibility. The flexible substrate fabricated from the composition comprises a glass transition temperature of more than 180° C. The flexible substrate has a dielectric constant of between 6-60 at frequency of more than 1 GHz, and has a dielectric loss of between 0.003-0.03 at frequency of more than 1 GHz.

Further, the substrate fabricated from the composition can be used as a flexible printed circuit board. For example, the substrate can be further employed in a copper clad laminate, a wireless microphone circuit board, an aerial circuit board, or a capacitor element.

Embodiments of the invention provide a method for preparing the aforementioned composition, comprising the following steps: (A) providing at least one thermosetting organic resin dissolved in a solvent to obtain a solution; (B) adding at least one flexile macromolecule, a curing agent, and a catalyst into the solution; and (C) adding SrTiO3 and/or Ba(Sr)TiO3 ceramic particle into the solution. Particularly, the solvent can comprise DMF or toluene, the curing agent comprises diamine, dianhydride, or phenolic resins, such as phenol based resin (such as

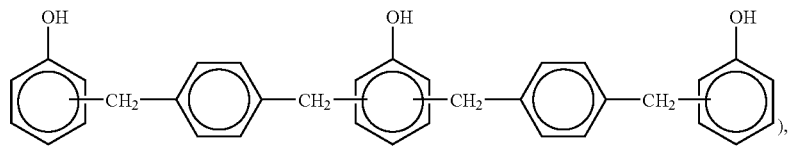

naphthol based resin (such as

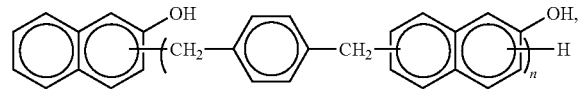

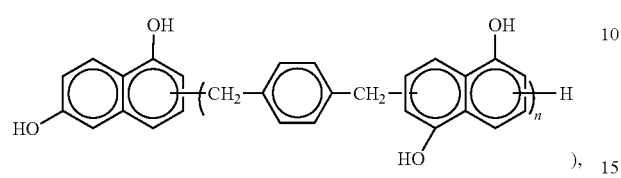

), terpene phenol resin (such as

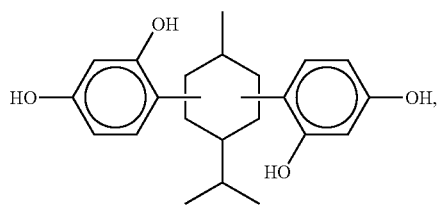

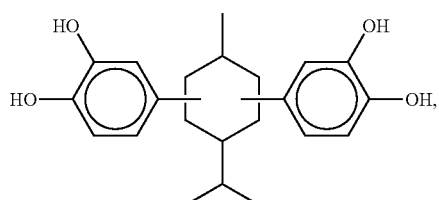

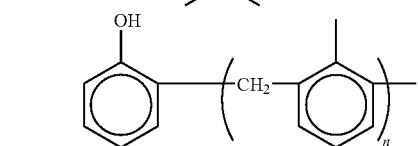

), dicyclopentadiene resin (such as

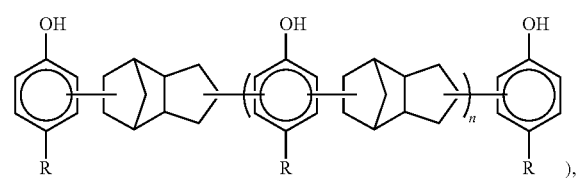

4,4',4"ethylidene trisphenol (such as

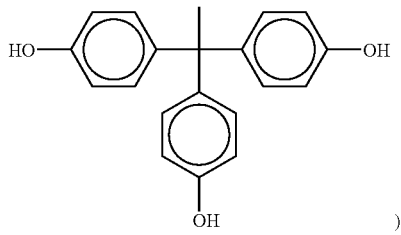

), tetra phenylolethane (such as

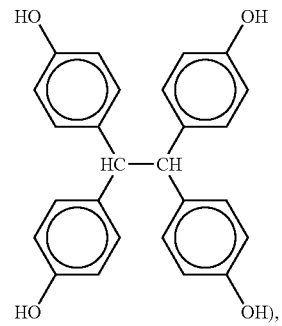

), tetraxylenol ethane (such as

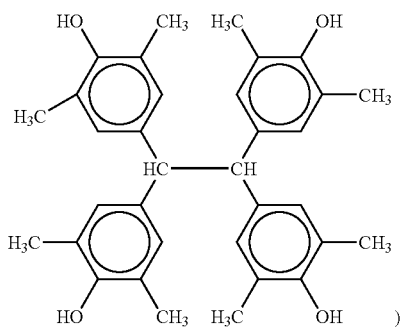

), or tetracresololethane (such as

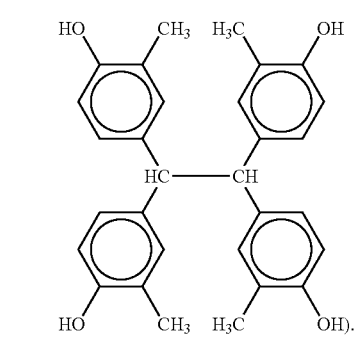

).

The catalyst comprises boron trifluoride complex, tertiary amines, metal oxide, single-ring oxide, or imidazole such as 1-methylimidzaole, 1,2-dimethylimidazole, 2-heptadecylimidazole, or 2-ethyl-4-methylimiazol.

After adding SrTiO3 and/or Ba(Sr)TiO3 ceramic particle, the solution can be dispersed by a sander for 0.5-3 hrs for a composition with an average particle size of between 80-500 nm.

In an embodiment, after step (B), a dispersing agent can be added into the solution. The dispersing agent comprises polyester-amide, polyester, or copolymer of polyester-amide/polyester. Further, an adhesion promoting agent (such as

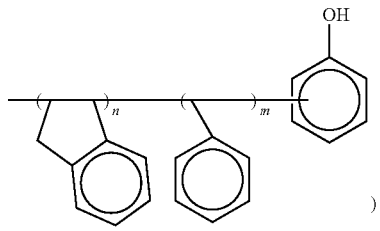

or a coupling agent (such as silane coupling agent (epoxy silane or amino silane)) can be added into the solution after step (B).

The following examples are intended to illustrate the invention more fully without limiting their scope, since numerous modifications and variations will be apparent to those skilled in this art.

Composition Preparation

Example 1

The preparation flows of flexible and low dielectric loss compositions 1-1-1-13 (Examples 1-1-1-13) of the invention were disclosed. First, bisphenol-A diglycidyl ether (sold by Chang Chun Resin Co., with a trade number of 188EL), tetrabromo disphenol-A diglcidyl ether (sold by Chang Chun Resin Co., with a trade number of BEB-350), cyclo aliphatic epoxy (sold by DIC with a trade number of HP-7200), multifunctional epoxy, and polyphenylene ether resin (PPE) were mixed with 5 ml DMF as solvent and heated to 90° C.~95° C. to dissolve the epoxy resin. Next, polyvinyl Butyral (PVB) (sold by Chang Chun Resin Co.), CTBN (sold by ZEON Chemical), or styrene-ethylenelbutylene-styrene (SEBS) (sold by Kraton) was added the previous above solution, and 4,4'-Methylenedianiline (curing agent) (sold by ACROS), and 2-Ethyl-4-methylimidazole (2E4MI) (catalyst) (sold by ACROS) were added into the previous above solution. After dissolution of the curing agent and the catalyst, polyester dispersing agent was added into the solution. After completely stirring and cooling to room temperature, SrTiO3 was added into the solution with violent stirring, respectively obtaining compositions 1-1-1-13 of the invention. Further, CTBN (sold by ZEON Chemical) can be previously reacted with 0.2 g epoxy resin and triphenylphosphine (TPP) at 120° C. for 3 hr, obtaining CTBN previously reacted with TPP. The amounts of each component of compositions 1-1-1-13 are listed in Table. 1.

TABLE 1

| | Example 1-1 | Example 1-2 | Example 1-3 | Example 1-4 | Example 1-5 | Example 1-6 |
|---|---|---|---|---|---|---|
| bisphenol-A diglycidyl ether[a] (g) | 5.50 | 8.10 | 6.20 | 8.05 | 8.02 | 8.07 |
| tetrabromo disphenol-A diglcidyl ether[a] (g) | 4.10 | 5.50 | 4.70 | 5.60 | 5.56 | 5.49 |
| cyclo aliphatic epoxy[a] (g) | 1.15 | 1.30 | 0.8 | 1.35 | 1.32 | 1.30 |
| multifunctional epoxy[a] (g) | 1.55 | 1.80 | 1.0 | 1.70 | 1.78 | 1.76 |
| PPE[a] (g) | 3 | 0 | 3 | 0 | 0 | 0 |
| PB[a] (g) | 0 | 0 | 2 | 0 | 0 | 0 |
| 4,4'-Methylene dianiline[b] (g) | 3.50 | 4.20 | 4.0 | 4.25 | 4.22 | 4.20 |
| 2E4MI[c] (g) | 0.06 | 0.07 | 0.07 | 0.07 | 0.07 | 0.07 |
| polyester[d] (g) | 2.5 | 2.5 | 2.5 | 2.5 | 2.5 | 2.5 |
| PVK[e] (g) | 3.0 | 0 | 0 | 0 | 0 | 3.0 |
| CTBN[e] (g) | 0 | 2.80 | 0 | 0 | 2.9 | 0 |
| SEBS[e] (g) | 0 | 0 | 3.20 | 0 | 0 | 0 |
| Modified CTBN[e] (g) | 0 | 0 | 0 | 10 | 0 | 0 |
| SrTiO3[f] (g) | 70.6 | 76.2 | 79.6 | 20 | 0 | 0 |
| Ba(Sr)TiO3[g] (g) | 0 | 0 | 0 | 0 | 0 | 0 |
| SrTiO3—Ca[h] (g) | 0 | 0 | 0 | 0 | 76.4 | 0 |
| NPO-90(g)[i] | 0 | 0 | 0 | 0 | 0 | 82.2 |

TABLE 1-continued

|  | Example 1-7 | Example 1-8 | Example 1-9 | Example 1-10 | Example 1-11 | Example 1-12 | Example 1-13 |
|---|---|---|---|---|---|---|---|
| bisphenol-A diglycidyl ether[a] (g) | 6.23 | 6.25 | 5.50 | 5.52 | 8.07 | 8.05 | 16.70 |
| tetrabromo disphenol-A diglcidyl ether[a] (g) | 4.68 | 4.70 | 5.50 | 5.52 | 5.49 | 5.52 | 0 |
| cyclo aliphatic epoxy[a] (g) | 0.8 | 0.9 | 0.8 | 0.87 | 1.30 | 1.32 | 0 |
| multifunctional epoxy[a] (g) | 1.03 | 1.0 | 1.2 | 1.25 | 1.76 | 1.74 | 0 |
| PPE[a] (g) | 3 | 3 | 0 | 0 | 0 | 0 | 0 |
| PB[a] (g) | 2 | 2 | 0 | 0 | 0 | 0 | 0 |
| 4,4'-Methylenedianiline[b] (g) | 4.22 | 4.2 | 3.16 | 3.15 | 4.20 | 4.17 | 4.30 |
| 2E4MI[c] (g) | 0.07 | 0.07 | 0.05 | 0.05 | 0.07 | 0.07 | 0.07 |
| polyester[d] (g) | 2.5 | 2.5 | 0.6 | 2.2 | 0.6 | 0.6 | 0.6 |
| PVK[e] (g) | 2.9 | 2.86 | 1.5 | 1.0 | 20 |  | 3.20 |
| CTBN[e] (g) | 0 | 0 | 0 | 0 | 0 | 0 | 0 |
| SEBS[e] (g) | 0 | 0 | 0 | 0 | 0 | 4.2 | 0 |
| Modified CTBN[e] (g) | 0 | 0 | 0 | 0.8 | 20 | 0 | 0 |
| SrTiO$_3$[f] (g) | 0 | 0 | 20 | 75 | 20 | 20 | 75 |
| Ba(Sr)TiO$_3$[g] (g) | 0 | 82.0 | 0 | 0 | 0 | 60 | 0 |
| SrTiO$_3$—Ca[h] (g) | 0 | 0 | 0 | 0 | 0 | 0 | 0 |
| NPO-90(g)[i] | 82.3 | 0 | 0 | 0 | 0 | 0 | 0 |

[a] epoxy resin;
[b] curing agent;
[c] catalyst;
[d] dispersing agent;
[e] softening agent;
[f] ceramic particle;
[g] ceramic particle with a particle size between 100-700 nm;
[h] ceramic particle doped with Ca ion (with a particle size between 0.3 μm~1.2 μm);
[i] ceramic particle doped with Ba, Ti, Zr, Sn, and Mn (with a particle size between 0.4 μm~1.8 μm).

Comparative Example 1

The Comparative Example 1 was performed as Example 1 excepting the changes of ceramic particle and soft agent. The ingredients and amounts of the compositions 1-1-1-4 in Comparative Example 1 are shown in Table 2.

TABLE 2

|  | 1-1 | 1-2 | 1-3 | 1-4 |
|---|---|---|---|---|
| diglycidyl ether of bisphenol-A[a] (g) | 7.50 | 5.20 | 7.40 | 5.52 |
| Tetrabromo bisphenol A[a] (g) | 5.20 | 4.10 | 5.15 | 4.32 |
| cycloaliphatic epoxy epoxy resin[a] (g) | 1.10 | 0.8 | 1.10 | 0.87 |
| Multi-functional group epoxy resin[a] (g) | 1.60 | 0.9 | 1.60 | 1.25 |
| PPE[a] (g) | 0 | 3 | 0 | 0 |
| PB[a] (g) | 0 | 2 | 0 | 0 |
| diamine[b] (g) | 3.80 | 3.20 | 3.80 | 3.15 |
| 2E4MI[c] (g) | 0.06 | 0.06 | 0.06 | 0.05 |
| dispersing agent[d] (g) | 2.50 | 2.50 | 0 | 2.2 |
| Polyvinyl butyral[e] (g) | 0 | 0 | 0 | 0.5 |
| CTBN[e] (g) | 0 | 0 | 0 | 0 |
| Styrene-Ethylene-Butylene-Styrene[e] (g) | 0 | 0 | 0 | 0 |
| CTBN (pretreatment)[e] (g) | 0 | 0 | 0 | 0 |
| BaTiO$_3$[f] (g) | 63.0 | 0 | 55.1 | 52.0 |
| SrTiO$_3$[f] (g) | 0 | 0 | 0 | 0 |

[a] epoxy resin;
[b] curing agent;
[c] catalyst;
[d] dispersing agent;
[e] softening agent;
[f] ceramic particle;
[g] ceramic particle with a particle size between 100-700 nm;
[h] ceramic particle doped with Ca ion (with a particle size between 0.3 μm~1.2 μm);
[i] ceramic particle doped with Ba, Ti, Zr, Sn, and Mn (with a particle size between 0.4 μm~1.8 μm).

Measurement of Substrate Fabricated Form Composition

The compositions of Example 1 and Comparative Examples 1 were dispersed by a sander and respectively coated on a copper foil. The coatings were heated at 120° C. for 30 min, obtaining resin coated copper. Next, the resin coated copper was laminated with another copper foil at 200° C. for 2.5 hr, obtaining organic/inorganic copper clad lamination. Finally, the properties of copper clad lamination were measured, and the results were shown in Table 3. The substrates fabricated from the compositions 1-1-1-4 of Comparative Example 1 exhibit inferior flexibility, machinability and lower peeling strength than substrates fabricated from the compositions 1-1-1-13 of Example 1, due to the absence of dispersing agent and softening agent. Further, the substrate fabricated from the composition 1-4 of Comparative Example 1 does not exhibit improved flexibility due to the minimized amount of softening agent. Moreover, according to the substrates fabricated from the composition 1-4 of Example 1, the CTBN previously reacted with TPP can increase the glass transition temperature and mechanical strength. As shown in Table. 3, the substrates fabricated from the compositions of Example 1 exhibit higher dielectric constant, higher flexibility, and lower dielectric loss than substrates fabricated from the compositions of Comparative Example 1.

TABLE 3

|  | Example 1 | | | | | |
| --- | --- | --- | --- | --- | --- | --- |
|  | 1-1 | 1-2 | 1-3 | 1-4 | 1-5 | 1-6 |
| Tg (° C.) | 181 | 180 | 180 | 184 | 181 | 183 |
| Dielectric constant (1 MHz) | 25.20 | 26.55 | 25.73 | 26.32 | 25.86 | 21.02 |
| Dielectric constant (5 GHz) | 24.34 | 25.69 | 24.96 | 25.46 | 25.18 | 20.75 |
| Dielectric loss (1 MHz) | 0.016 | 0.023 | 0.008 | 0.02 | 0.022 | 0.007 |
| Dielectric loss (5 GHz) | 0.017 | 0.025 | 0.0083 | 0.021 | 0.024 | 0.008 |
| Peeling strength[a] (1 b/in) | 5.4 | 5.6 | 5.3 | 5.9 | 5.8 | 5.2 |
| Flexibility (times)[b] | >5 | >5 | >5 | >5 | >5 | >5 |
| PCB processing[c] | good | good | good | good | good | good |
| Solder Resistance test[d] | pass | pass | pass | pass | pass | pass |

|  | Example 1 | | | | | | |
| --- | --- | --- | --- | --- | --- | --- | --- |
|  | 1-7 | 1-8 | 1-9 | 1-10 | 1-11 | 1-12 | 1-13 |
| Tg (° C.) | 179 | 177 | 172 | 183 | 159 | 179 | 165 |
| Dielectric constant (1 MHz) | 19.03 | 23.82 | 16.60 | 35.87 | 10.2 | 25.32 | 28.30 |
| Dielectric constant (5 GHz) | 18.73 | 23.34 | 15.10 | 34.62 | 9.1 | 24.76 | 26.90 |
| Dielectric loss (1 MHz) | 0.005 | 0.009 | 0.022 | 0.015 | 0.023 | 0.015 | 0.024 |
| Dielectric loss (5 GHz) | 0.006 | 0.010 | 0.026 | 0.017 | 0.026 | 0.016 | 0.026 |
| Peeling strength[a] (1 b/in) | 5.1 | 5.2 | 6.0 | 4.6 | 6.3 | 5.5 | 6.8 |
| Flexibility (times)[b] | >5 | >5 | >5 | >5 | >5 | >5 | >5 |
| PCB processing[c] | good | good | good | good | good | good | good |
| Solder Resistance test[d] | pass | pass | pass | pass | pass | pass | pass |

|  | Comparative Example 1 | | | |
| --- | --- | --- | --- | --- |
|  | 1-1 | 1-2 | 1-3 | 1-4 |
| Tg (° C.) | 192 | 183 | 192 | 184 |
| Dielectric constant (1 MHz) | 26.80 | 25.23 | 23.77 | 26.30 |
| Dielectric constant (5 GHz) | 24.55 | 24.31 | 20.36 | 24.33 |
| Dielectric loss (1 MHz) | 0.027 | 0.010 | 0.031 | 0.029 |
| Dielectric loss (5 GHz) | 0.065 | 0.012 | 0.067 | 0.066 |
| Peeling strength[a] (1 b/in) | 5.1 | 5.0 | 4.2 | 5.2 |
| Flexibility (times)[b] | 1, broke | 1, broke | 1, broke | 1, broke |

TABLE 3-continued

| PCB processing[c] | bad | bad | bad | good |
|---|---|---|---|---|
| Solder Resistance test[d] | pass | pass | Non-pass | pass |

[a]Peeling strength was tested byIPC-650.
[b]Flexibility was tested by JIS K5400.
[c]currently PCB process.
[d]Solder Resistance test: 288° C./3 min after PCT × 2 hr While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flexible, low dielectric loss composition, used to fabricate a flexible substrate, comprising:
   $SrTiO_3$ and/or $Ba(Sr)TiO_3$ ceramic particle, with a particular size between 30 nm and 2 µm, in an amount of 20-80% by weight of the composition;
   at least one flexile macromolecule in an amount of 1.0-50% by weight of the composition, wherein the macromolecules have functional groups of hydroxyl group, carboxyl group, allyl group, amino group, or chain aliphatic epoxy group; and
   a thermosetting organic resin.

2. The composition as claimed in claim 1, wherein the ceramic particle is doped with at least one metal ion comprising Ca, Mg, Zr, Bi, Co, Si, Mn, Sn or Zn.

3. The composition as claimed in claim 1, wherein the ceramic particle is NPO ceramic material.

4. The composition as claimed in claim 1, wherein the macromolecules with hydroxyl group comprises polyvinyl butyral or hydroxyl groups terminated polyester.

5. The composition as claimed in claim 1, wherein the macromolecules with carboxyl group comprises carboxylic acid terminated acrlonitrile or carboxylic acid terminated polyester.

6. The composition as claimed in claim 1, wherein the macromolecules with allyl group comprises polybutadiene, styrene-ethylene/butylene-styrene, styrene-butadiene-styrene or styrene-isoprene-styrene.

7. The composition as claimed in claim 1, wherein the macromolecules with amino group comprises polyamide, polyamide-polyimide, polyurea, or polyurethanes.

8. The composition as claimed in claim 1, wherein the macromolecules is reacted with an epoxy resin in advance, wherein the epoxy resin comprises diglycidyl ether of bisphenol-A, naphthyl epoxy resin, diphenyl epoxy resin, or phenolic varnish epoxy resin.

9. The composition as claimed in claim 1, wherein the thermosetting organic resin comprises epoxy resin/polyphenyl ether, epoxy resin/polyphenyl ether/polybutadiene or epoxy resin/acrylic resin.

10. The composition as claimed in claim 1, further comprising a dispersing agent, wherein the dispersing agent comprises polyester-amide, polyester, or copolymer of polyester-amide/polyester.

11. The composition as claimed in claim 10, wherein the dispersing agent is in an amount of 1-10% by weight of the composition.

12. The composition as claimed in claim 1, wherein the flexible substrate comprises a printed circuit board or integrated circuit board.

13. The composition as claimed in claim 1, wherein the flexible substrate has a dielectric constant of between 6-60 at frequency of more than 1 GHz.

14. The composition as claimed in claim 1, wherein the flexible substrate has a dielectric loss of between 0.003-0.03 at frequency of more than 1 GHz.

15. A method for preparing a flexible, low dielectric loss composition, comprising:
   providing at least one thermosetting organic resin dissolved in a solvent to obtain a solution;
   adding at least one flexile macromolecule, a curing agent, and a catalyst into the solution wherein the flexile macromolecules have functional groups of hydroxyl group, carboxyl group, allyl group, amino group, or chain aliphatic epoxy group; and
   adding $SrTiO_3$ and/or $Ba(Sr)TiO_3$ ceramic particle into the solution, wherein the $SrTiO_3$ and/or $Ba(Sr)TiO_3$ ceramic particle has a particular size between 30 nm and 2 µm.

16. The method as claimed in claim 15, wherein the thermosetting organic resin comprises epoxy resin/polyphenyl ether, epoxy resin/polyphenyl ether/polybutadiene or epoxy resin/acrylic resin.

17. The method as claimed in claim 15, wherein the macromolecules with hydroxyl group comprises polyvinyl butyral or hydroxyl groups terminated polyester.

18. The composition as claimed in claim 1, wherein the macromolecules with carboxyl group comprises carboxylic acid terminated acrlonitrile or carboxylic acid terminated polyester.

19. The method as claimed in claim 15, wherein the macromolecules with allyl group comprises polybutadiene, styrene-ethylene/butylene-styrene, styrene-butadiene-styrene or styrene-isoprene-styrene.

20. The method as claimed in claim 15, wherein the macromolecules with amino group comprises polyamide, polyamide-polyimide, polyurea, or polyurethanes.

21. The method as claimed in claim 15, wherein the macromolecules is reacted with an epoxy resin in advance, wherein the epoxy resin comprises diglycidyl ether of bisphenol-A, naphthyl epoxy resin, diphenyl epoxy resin, or phenolic varnish epoxy resin.

22. The method as claimed in claim 15, wherein the curing agent comprises diamine, dianhydride, or phenolic resins.

23. The method as claimed in claim 15, wherein the catalyst comprises boron trifluoride complex, tertiary amines, metal oxide, single-ring oxide, or imidazole.

24. The method as claimed in claim 15, wherein the ceramic particle is doped with at least one metal ion comprising Ca, Mg, Zr, Bi, Co, Si, Mn, Sn or Zn.

25. The method as claimed in claim 15, after adding at least one flexile macromolecule, the curing agent, and the catalyst, further comprising adding a dispersing agent.

26. The method as claimed in claim 25, wherein the dispersing agent comprises polyester-amide, polyester, or copolymer of polyester-amide/polyester.

27. The method as claimed in claim 15, after adding at least one flexile macromolecule, the curing agent, and the catalyst, further comprising adding an adhesion promoting agent or a coupling agent.

* * * * *